United States Patent
Bhatia et al.

(10) Patent No.: US 7,203,082 B1
(45) Date of Patent: Apr. 10, 2007

(54) RACE CONDITION IMPROVEMENTS IN DUAL MATCH LINE ARCHITECTURES

(75) Inventors: Ajay Bhatia, Santa Clara, CA (US); Sanjay M. Wanzakhade, San Jose, CA (US); Shashank Shastry, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 22 days.

(21) Appl. No.: 11/144,123

(22) Filed: May 31, 2005

(51) Int. Cl.
*G11C 15/04* (2006.01)
*G06F 12/00* (2006.01)

(52) U.S. Cl. .................. 365/49; 365/203; 365/204; 365/189.07; 711/118; 711/108

(58) Field of Classification Search .............. 365/49, 365/203, 204, 189.07; 711/108, 118
See application file for complete search history.

(56) References Cited

U.S. PATENT DOCUMENTS

| | | | |
|---|---|---|---|
| 5,422,838 A | 6/1995 | Lin | 365/49 |
| 6,704,216 B1 | 3/2004 | Cheng et al. | 365/49 |
| 6,760,242 B1 * | 7/2004 | Park et al. | 365/49 |
| 6,768,659 B2 * | 7/2004 | Gillingham et al. | 365/49 |
| 2003/0123269 A1 * | 7/2003 | Gillingham et al. | 365/49 |

OTHER PUBLICATIONS

Ho, et al., "A Process-Portable 64b Embedded Microprocessor with Graphics Extensions and a 3.6GB/S Interface," International Solid-State Circuits Conference, ISSCC-2001, 3 pages.
Mohan, et al., "Low Power Dual Matchline Ternary Content Addressable Memory," IEEE International Symposium on Circuits and Systems, (ISCAS), 2004, 4 pages.
U.S. Appl. No. 11/141,301, filed May 31, 2005.

* cited by examiner

*Primary Examiner*—Andrew Q. Tran
(74) *Attorney, Agent, or Firm*—Robert C. Kowert; Meyertons, Hood, Kivlin, Kowert & Goetzel, P.c.

(57) ABSTRACT

Dual match line circuits having race condition improvements. A dual match line circuit may include precharge logic configured to precharge each of a hit match line, a miss match line and an evaluate node to an asserted state, where a coupling device couples the hit and miss match lines to the evaluate node. The miss match line may discharge through a number of load devices that may be activated by respective miss signals. A positive feedback circuit coupled to the miss match line may accelerate its discharge. The hit match line may be additionally coupled to discharge through a discharge path. The hit and miss match lines may be electrically isolated from one another, such that when any of the respective miss signals is asserted, current from the hit match line does not discharge through the miss match line.

23 Claims, 12 Drawing Sheets

RACE CONDITION IMPROVEMENTS IN DUAL MATCH LINE ARCHITECTURES

BACKGROUND OF THE INVENTION

1. Field of the Invention

This invention relates to logic circuits, and more particularly, to techniques for improving performance of match line circuits.

2. Description of the Related Art

In some digital logic applications, a need may arise to combine a substantial number of logic signals into one or more other signals according to a particular logic function. For example, whether two N-bit binary data patterns of match one another may be a function of whether each bit of one pattern matches a respective bit of the other pattern, for each bit within the patterns. Specifically, the overall matching condition for both patterns may be a logical AND of the matching condition for each bit position within the patterns.

However, as N increases, so does the complexity of quickly and efficiently combining a large number of signals into a particular matching function, such as an AND function. For example, using logic gates employing static CMOS (complementary metal-oxide semiconductor) circuit styles, in many process technologies logic gate size and performance degrades quickly for gates having more than three or four inputs. Consequently, multiple levels of static logic gates may need to be hierarchically employed to implement wide combinatorial functions, increasing implementation area and evaluation latency.

Conventional dynamic circuit styles may improve evaluation speed of wide functions relative to static circuit styles. For example, a conventional dynamic implementation of a wide OR-type function may include far fewer series-connected (and therefore performance-limiting) devices than its static equivalent. However, conventional dynamic circuits present challenges with respect to power consumption, noise sensitivity, and synchronization with other circuits, for example.

SUMMARY

Various embodiments of dual match line circuits having race condition improvements are disclosed. In one embodiment, a dual match line circuit may include precharge logic configured to precharge each of a hit match line, a miss match line and an evaluate node to an asserted state, where the hit match line is coupled to a first group of load devices and the miss match line is coupled to discharge through a second group of load devices, each of which may be activated for discharging by a respective miss signal. The dual match line circuit may also include a positive feedback circuit coupled to the miss match line and configured to accelerate discharge of the miss match line in response to activation of one or more of the second group of load devices. The hit match line and the miss match line may be coupled to the evaluate node via respective terminals of a coupling device. The hit match line may be additionally coupled to a discharge path that is activated for discharging by at least a hit signal. The hit match line and the miss match line may be electrically isolated from one another, such that when one or more of the respective miss signals are asserted, current from the hit match line does not discharge through the miss match line.

A method is further contemplated that in one embodiment includes precharging each of a hit match line, a miss match line and an evaluate node to an asserted state, where the hit match line and the miss match line are coupled to the evaluate node via respective terminals of a coupling device. In response to detecting assertion of a hit signal, the method may include discharging the hit match line through a discharge path. In response to detecting assertion of one or more of a plurality of miss signals, the method may include discharging the miss match line through one or more of a second group of load devices, where each of the second group of load devices is activated for discharging by a respective one of the plurality of miss signals. In response to activation of one or more of the second group of load devices, the method may include a positive feedback coupled to the miss match line accelerating discharge of the miss match line. The hit match line and the miss match line may be electrically isolated from one another, such that when one or more of the miss signals are asserted, current from the hit match line does not discharge through the miss match line.

BRIEF DESCRIPTION OF THE DRAWINGS

Other aspects of the invention will become apparent upon reading the following detailed description and upon reference to the accompanying drawings in which.

Figure 1:
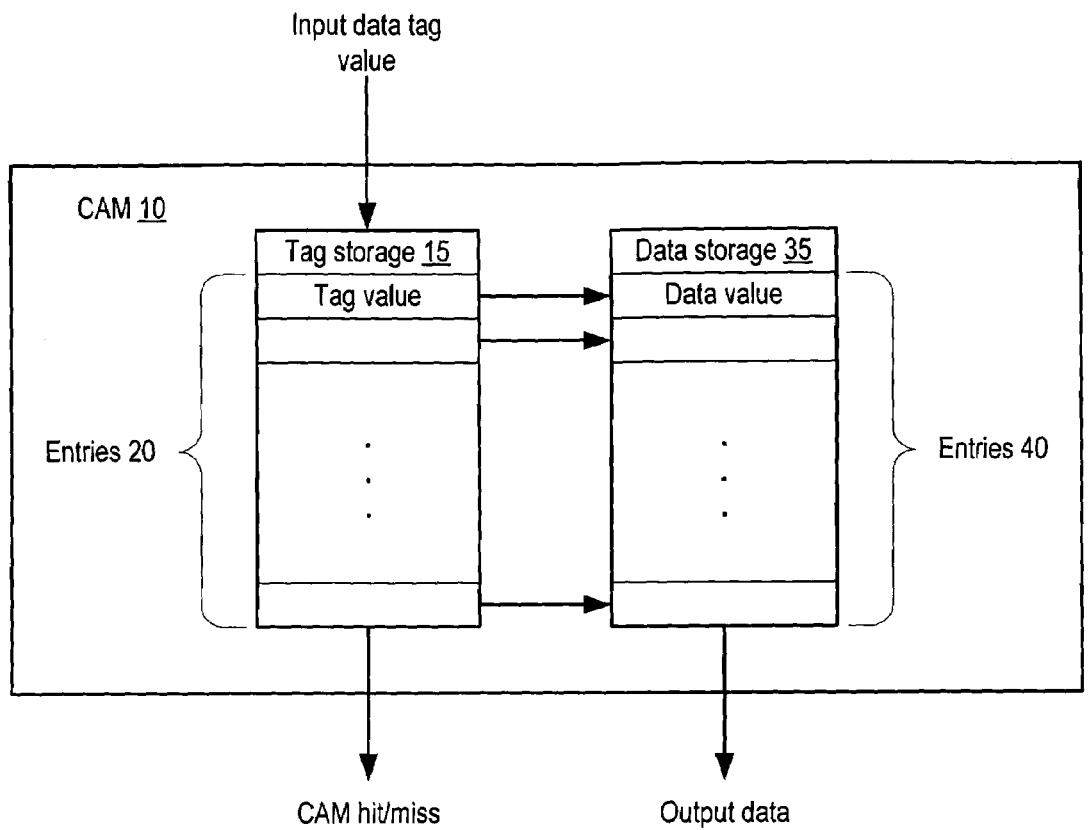
FIG. 1 is a block diagram illustrating one embodiment of a content addressable memory (CAM).

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF EMBODIMENTS

Overview of Content Addressable Memories

As mentioned above, in many different embodiments, a digital circuit may be configured to combine a large number of discrete signals into a smaller number of signals indicative of some logical function of the large number of signals. For example, a simple binary comparator circuit may be configured to perform a bitwise comparison of two N-bit inputs, yielding N individual match signals indicating whether corresponding bits of the inputs match. Whether both inputs match or mismatch may then be a function of the individual match signals. For example, if each individual match signal indicates a match, then an overall match of the two inputs may be indicated, such as by asserting a single, global match signal. Otherwise, an overall mismatch of the two inputs may be indicated, such as by deasserting a global match signal.

One particular embodiment of a circuit that may employ such a comparison function is illustrated in FIG. 1. In the illustrated embodiment, content addressable memory (CAM) 10 includes tag storage 15 (or simply, tags 15) that includes a number of entries 20 as well as data storage 35 (or simply, data 35) that includes a number of entries 40, where the entries 40 of data 35 correspond respectively to the entries 20 of tags 15. In one embodiment, each of entries 20 includes a number of tag bits, while each of entries 40 includes a number of data bits. In various embodiments, entries 20 and 40 of CAM 10 may be sized to implement any suitable number of tag and data bits, and tag and data entries may be of the same or different sizes.

It is noted that in some embodiments, CAM 10 may include additional components, input signals and/or output signals not shown in FIG. 1. For example, CAM 10 may include one or more input data paths for loading tag and data values into tags 15 and data storage 35, control logic (e.g., least recently used (LRU) or least frequently used (LFU) logic) configured to select entries 20 and 40 for replacement during a load, or other control or data interfaces. It is also contemplated that in some embodiments, CAM 10 may omit data storage 35. In such an embodiment, CAM 10 may be configured to output a number of match signals corresponding to tag entries 20, which may be used to manipulate a data storage structure (e.g., a RAM array) external to CAM 10.

In typical data memories, such as random access memories (RAM), memory locations may be accessed by presenting to the memory an address value that uniquely specifies a particular entry within the memory. In many RAM embodiments, the number of bits of the address value directly determines (e.g., via decoding) the number of accessible entries within the RAM. By contrast, an entry within CAM 10 may generally be accessed by presenting a data tag value to CAM 10, determining whether any entry 20 within tags 15 matches the input data tag value, and if there is a matching tag value for a particular entry 20, selecting a corresponding entry 40 within data storage 35 and outputting its data. If a matching tag value exists for a given input data value, a CAM hit may be said to occur; otherwise, a CAM miss occurs. In the illustrated embodiment, CAM hit/miss status may be indicated as an output of CAM 10 along with the output data. In many embodiments, a CAM may be managed by hardware or software to ensure that at most one copy of a given tag value exists within tags 15, thus preventing the ambiguity that might occur if two identical tags were to match an input data value.

Whereas accessing data within a typical RAM may require specific knowledge of the location of data within the RAM (e.g., an address), data may be retrieved from CAM 10 irrespective of what entry 40 the data occupies. That is, whether data of interest is present within CAM 10 may be determined dependent upon whether a tag associated with the data of interest matches a tag entry 20 within tags 15. Further, there may be no direct correspondence between the size of the tag value used to index CAM 10 and the number of entries 20 and 40 included within CAM 10. As described in greater detail below in conjunction with the descriptions of FIGS. 10–14, the data-dependent access characteristics of CAM 10 may be useful in various types of processors and systems that are configured to act in response to detecting relationships among data.

Figure 2:
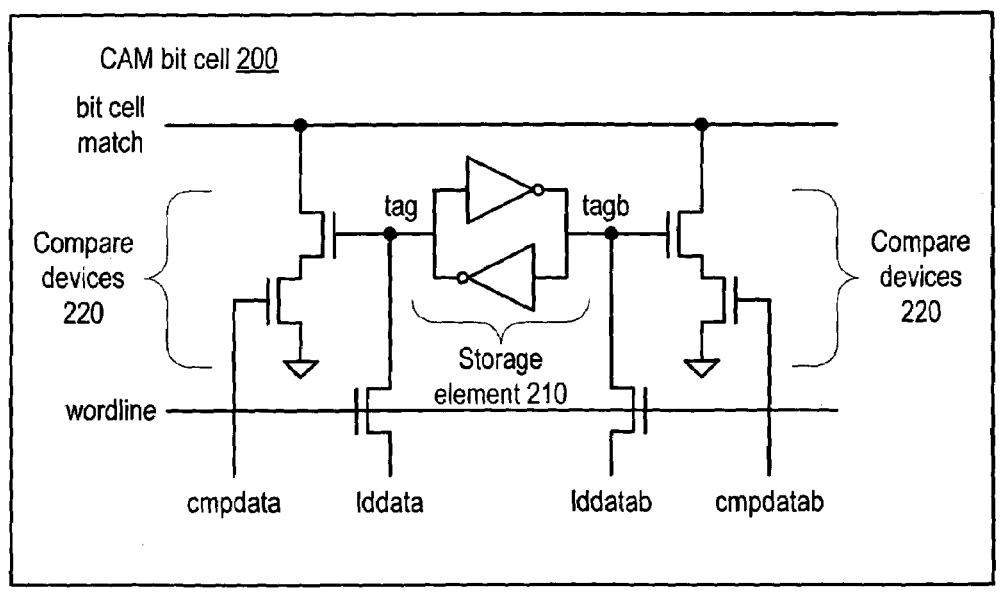
FIG. 2 is a block diagram illustrating one embodiment of a CAM bit cell.

One embodiment of a CAM bit cell that may be configured to store one bit of an entry 20 of CAM tags 15 is illustrated in FIG. 2. In the illustrated embodiment, CAM bit cell 200 includes a basic storage element 210 coupled to a variety of input and output nodes via a number of logic devices. In one embodiment, each device shown may be an N-type field effect transistor (NFET). However, it is contemplated that any suitable type of device configurable to operate as a logical switch (e.g., capable of switching from a conducting mode to a non-conducting mode dependent upon a state of one of its inputs) may be employed within bit cell 200. For example, in one embodiment, P-type FETs (PFETs) may be employed with appropriate changes in the logical sense of the associated signals. In other embodiments, other types of transistors or other devices may be employed, such as bipolar junction transistors, for example.

In the illustrated embodiment, storage element 210 may include a pair of static inverters coupled back-to-back to store a logic value, although in other embodiments, storage element 210 may employ other static or dynamic storage configurations. Storage element 210 may be configured to store a single tag bit of an entry 20 and the logical complement of that bit at the nodes labeled tag and tagb, respectively. (In general, the logically complemented or inverted sense of a signal is indicated herein by appending a "b" to the signal name.) A value may be loaded into storage element 210 by presenting the bit value to be loaded and its complement via the lddata/lddatab signals and asserting the wordline signal to couple the load data onto the tag/tagb nodes. Alternatively, the value stored in storage element 210 may be read by asserting the wordline signal and reading the value coupled onto the lddata/lddatab signals.

CAM bit cell 200 also supports a compare function in the illustrated embodiment. Specifically, in one embodiment, the bit cell match signal may be precharged to an asserted logic state, for example by a precharge logic device (not shown). With respect to the embodiment of FIG. 2, an asserted and a deasserted logic state may correspond respectively to logic 1 and 0 values, although it is understood that this correspondence may be reversed depending, for example, on the types of devices employed (e.g., N-type vs. P-type FET devices). After the bit cell match signal is precharged, a data bit, such as a bit of an input data tag value applied to CAM 10, may be presented for comparison with the stored data value on the cmpdata/cmpdatab signals. If the logic state of the data stored by storage element 210 is the same as the logic state of the data presented via the cmpdata/cmpdatab signals, the bit cell match signal may be discharged through one of the illustrated pairs of compare devices 220. For example, if a logic 1 value is stored at the node tag and a logic 1 value is presented via signal cmpdata, the bit cell match signal may discharge through the pair of compare devices 220 associated with the cmpdata signal.

By contrast, if the logic state of the data stored by storage element 210 differs from the logic state of the data presented via the cmpdata/cmpdatab signals, the bit cell match signal may remain precharged. For example, if logic 1 and 0 values are respectively stored at nodes tag/tagb and logic 0 and 1 values are respectively presented via signals cmpdata/cmpdatab, at least one of each pair of compare devices 220 will remain disabled, providing no path through which to discharge the bit cell match signal. It is contemplated that in some embodiments, data comparison within CAM bit cell 200 may be mutually exclusive with precharge of the bit cell match signal. For example, in one embodiment signals cmpdata/cmpdatab may be additionally qualified with a signal used to control precharging, such as a clock signal.

In the just-described embodiment of CAM bit cell 200, the compare function may be implemented as a logical exclusive-OR (XOR) function of the cmpdata signal and the tag node, in which logic value of the bit cell match signal is 0 if the cmpdata signal and the tag node have the same logic value and 1 if the logic values of cmpdata and tag differ. However, it is contemplated that in an alternative embodiment, CAM bit cell 200 may be configured to implement a logical exclusive-NOR (XNOR) function in which the logic value of the bit cell match signal is the inverse of the XOR case. For example, CAM bit cell 200 may be configured to perform an XNOR comparison by reversing the connection of the cmpdata/cmpdatab signals to their respective compare devices 220, such that the cmpdatab signal is coupled to the compare devices 220 associated with the tag node and vice versa. In XOR and XNOR versions of CAM bit cell 200, bit cell match signals may also be referred to respectively as miss or hit signals, as they may respectively indicate a data mismatch or match when asserted.

Figure 3:
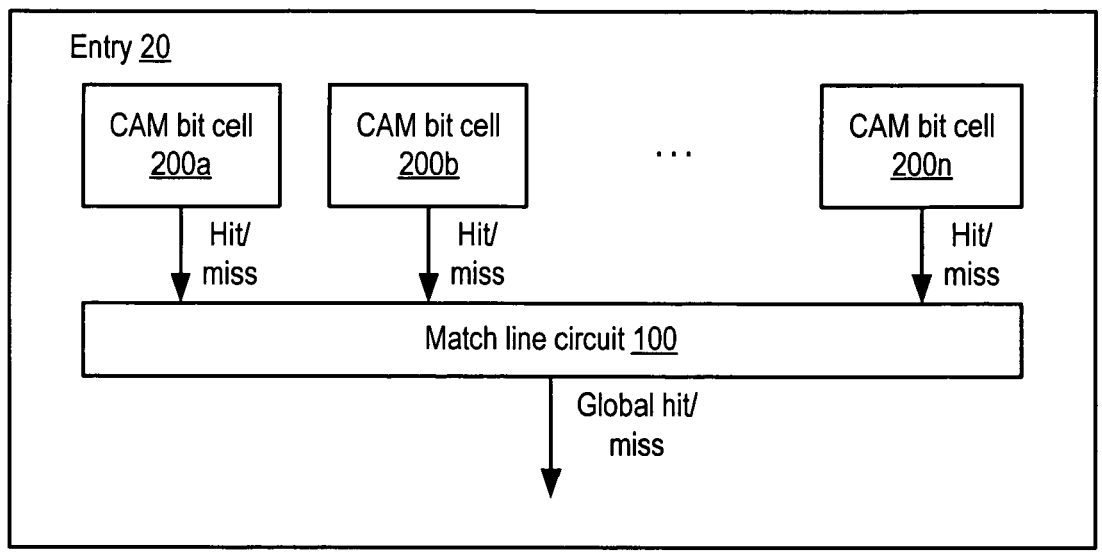
FIG. 3 is a block diagram illustrating one embodiment of a tag entry of a CAM including a number of CAM bit cells and a match line circuit.

As shown in FIG. 3, in one embodiment, each entry 20 of CAM 10 may include a number of instances of CAM bit cell 200a–n, each instance corresponding respectively to a bit of the tag value stored within an entry 20. Each individual CAM bit cell 200 may be configured to produce bitwise hit and/or miss signals. However, in order to determine whether the entirety of entry 20 matches an input data tag value, the individual hit/miss signals produced by CAM bit cells 200 may be combined into a global hit/miss signal corresponding to the entry 20 by a match line circuit 100.

Depending on whether hit or miss signals are used, the combination of signals from individual CAM bit cells 200 into a global hit/miss signal may resemble a logical AND or OR function of many different inputs. However, it may be difficult to quickly determine such a function. For example, in one embodiment CAM 10 may be used within a virtual memory translation buffer configured to cache virtual-to-physical memory address translations. In such an embodiment, CAM 10 may be accessed by presenting input data bits corresponding to a particular virtual page number to tags 15 and, if there is a matching entry 20, selecting a corresponding physical page number from data storage 35. However, in some embodiments, virtual page numbers may be on the order of 40 bits or more. Thus, determining whether a given entry 20 matches a particular virtual page number may entail combining 40 or more individual hit/miss signals from CAM bit cells 200 into a global hit/miss signal corresponding to given entry 20.

Further, in some embodiments, the time required to determine whether a hit exists within CAM 10 may contribute directly to the maximum rate at which the circuit including CAM 10 may operate. That is, CAM hit determination may be in the overall critical path of a processor or other type of circuit employing CAM 10. For example, as described in greater detail below, in one embodiment CAM 10 may be included within a set-associative cache of a processor, such that the global hit/miss signal for an entry 20 is used to select data to be read out of the cache. Thus, the speed of a cache access and possibly the entire processor may depend directly on the performance of match line circuit 100.

Additionally, evaluation speed may not be the only factor impacting the performance of match line circuit 100. In some embodiments, power consumption and overall area occupied by match line circuit 100 may be critical parameters to control. For example, in one embodiment, match line circuit 100 may be implemented as a single match line that is precharged to a default hit state and discharged if any of the individual hit/miss signals from CAM bit cells 200 indicate a bit cell miss. However, it may generally be the case that for a given CAM tag entry 20, global hits occur significantly less frequently than misses, since all bits of entry 20 must match for a global hit to occur, whereas only one bit need mismatch to cause a global miss. Consequently, if the default precharge state of a single match line is a hit state, the match line may frequently discharge as the relatively more common misses occur, increasing power consumption. In some embodiments, power consumption and evaluation speed may be improved by performing a hierarchical combination of hit/miss signals from CAM bit cells 200, rather than using a single match line with a large effective capacitance. However, such hierarchical techniques may substantially increase the size of match line circuit 100, potentially increasing the overall size of CAM 10.

Dual Match Line Circuits

Figure 4:
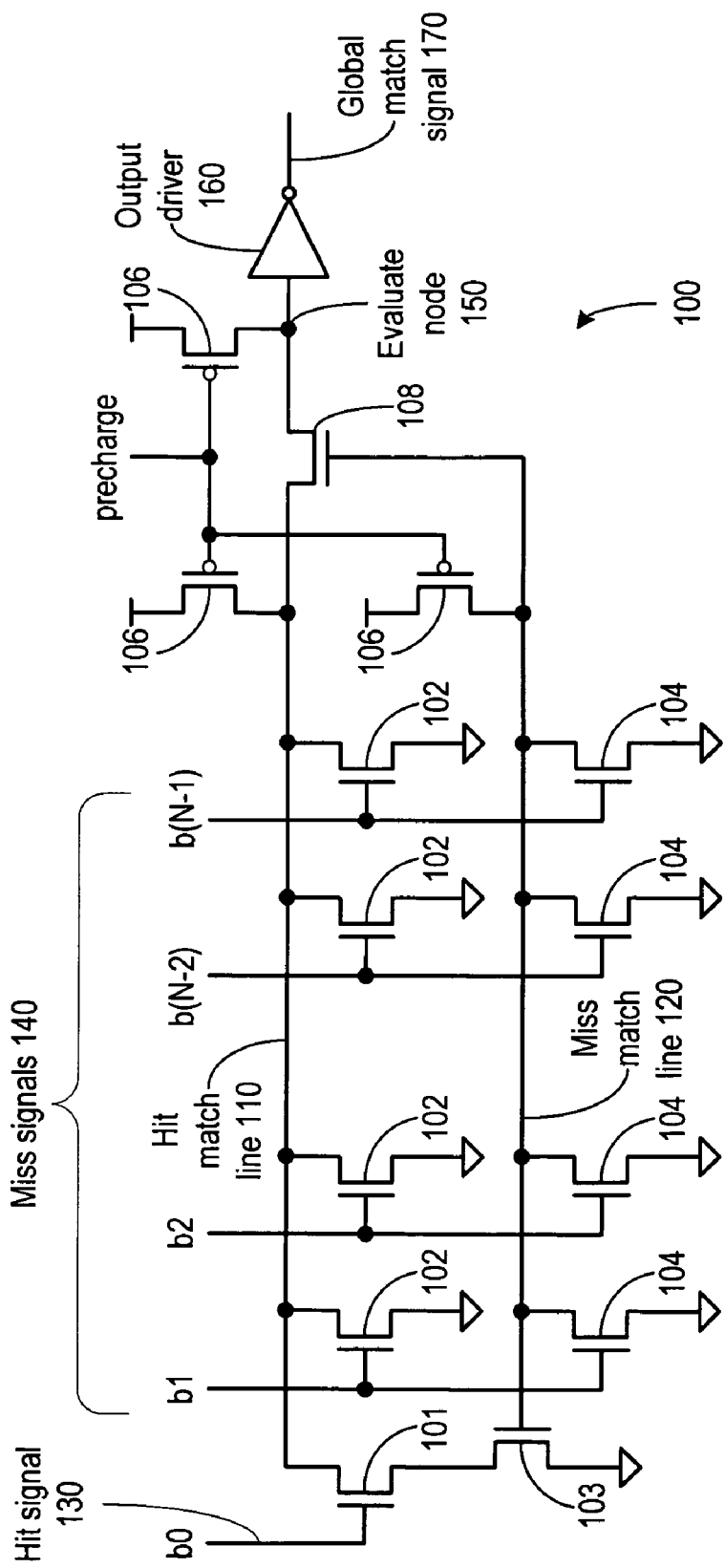
FIG. 4 is a block diagram illustrating one embodiment of a dual match line circuit.

In some embodiments, match line circuit 100 may implement dual match lines rather than a single match line as described above. One exemplary embodiment of a dual match line circuit is illustrated in FIG. 4. In the illustrated embodiment, dual match line circuit 100 includes a hit match line 110 and a miss match line 120 that are coupled to an evaluate node 150 through respective terminals of a coupling device 108. Dual match line circuit 100 also includes precharge devices 106 configured to precharge each of hit match line 110, miss match line 120 and evaluate node 150 to a logically asserted state, such as a logic 1 value, for example. An output driver 160 is coupled to evaluate node 150 to produce a global match signal 170.

In the illustrated embodiment, hit match line 110 is coupled to discharge through a first plurality of load devices 102, and miss match line 120 is coupled to discharge through a corresponding second plurality of load devices 104. Specifically, in one embodiment, each pair of load devices 102 and 104 is activated for discharging corresponding hit match line 110 and miss match line 120 by a respective one of a number of miss signals 140. In one embodiment, each of miss signals 140 corresponds to a respective CAM bit cell 200, for example the bit cell match signal for a CAM bit cell 200 configured to perform an XOR-type comparison as described above.

Additionally, in the illustrated embodiment, hit match line 110 is coupled to discharge through a pair of devices 101, 103 connected in series, where device 101 is activated for discharging by a hit signal 130 and device 103 is activated for discharging by miss match line 120. In one embodiment, hit signal 130 corresponds to a respective CAM bit cell 200, for example the bit cell match signal for a CAM bit cell 200 configured to perform an XNOR-type comparison as described above. In particular, in one embodiment each of hit signal 130 and miss signals 140 correspond respectively to a bit position, denoted b0 through b(N−1), of an N-bit tag entry 20 of CAM 10. However, it is noted that the specific bit positions to which hit signal 130 and miss signals 140 correspond may vary from that shown. For example, in various embodiments, hit signal 130 may correspond to a least significant bit position, a most significant bit position, or another bit position of an entry 20. Also, as described in greater detail below in conjunction with the descriptions of FIGS. 10–14, dual match line circuit 100 may be used in conjunction with circuits other than CAMs.

It is noted that in the illustrated embodiment, hit match line 110 and miss match line 120 are electrically isolated from one another, such that there is no path for electrical current from hit match line 110 to discharge through miss match line 120 during operation of dual match line circuit 100. As illustrated, hit match line 110 discharges either directly through one or more of devices 102, or through devices 101 and 103. However, in the latter case, device 103 may effectively isolate the node capacitance of miss match line 120 from hit match line 110, such that even though miss match line 120 may control activation of device 103, no significant amount of current from miss match line 120 may discharge through device 103.

As described above with respect to CAM bit cell 200, in various embodiments devices 101–104, 106 and 108 may be any suitable type of device configurable as a logical switch. For example, in the illustrated embodiment, devices 106 may be implemented as P-type FETs, while the remaining devices may be implemented as N-type FETs. However, in other embodiments, the types of these devices may be reversed with appropriate changes in the senses of hit signal 130 and miss signals 140. As mentioned previously, transistors or devices other than FETs may also be employed. Additionally, it is noted that in some embodiments, the physical dimensions of any single device illustrated within dual match line circuit 100 may be individually determined, for example to control the specific timing characteristics of the circuit. By extension, in some embodiments, multiple physical devices may be configured to perform the function of any single device shown. For example, instead of using a single large instance of a particular device 102, multiple smaller physically-distinct devices may be coupled in parallel to perform the same function.

Figure 5:
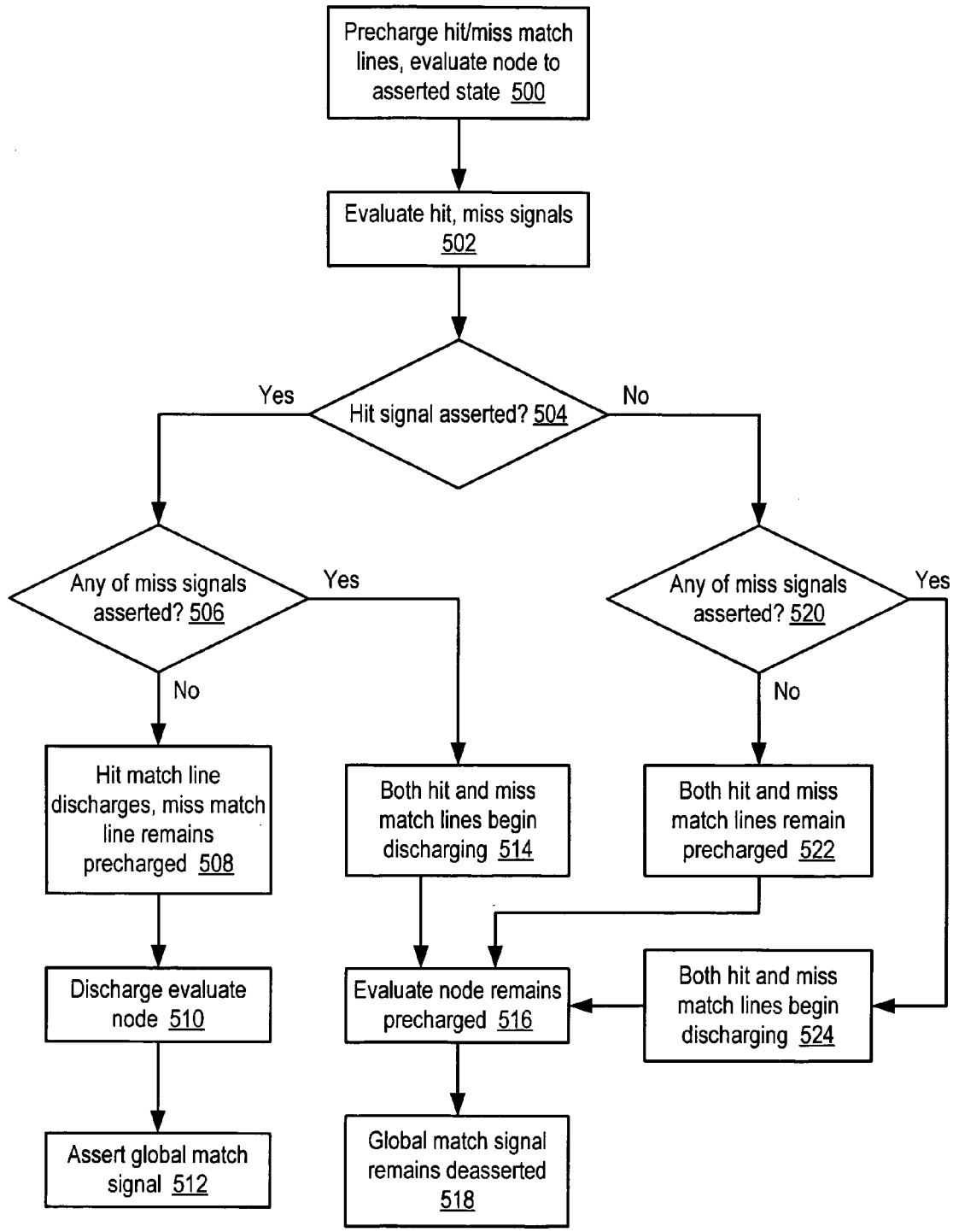
FIG. 5 is a flow diagram illustrating one embodiment of a method of operation of a dual match line circuit.

One embodiment of a method of operation of dual match line circuit 100 is illustrated in FIG. 5. It is noted that although some steps of FIG. 5 are illustrated sequentially for simplicity of explanation, in some embodiments of circuit 100 these steps may occur concurrently. Referring collectively to FIGS. 1–5, operation begins in block 500 where hit match line 110, miss match line 120 and evaluate node 150 are precharged to a logically asserted state. For example, in one embodiment, the precharge signal coupled to devices 106 may be driven to a logic 0 state, causing PFET devices 106 to electrically couple hit match line 110, miss match line 120 and evaluate node 150 to a voltage supply, thereby precharging these nodes to a logic 1 state. During precharge, hit signal 130 and miss signals 140 may be deasserted. For example, in one embodiment these signals may be qualified with the complement of the precharge signal within dual match line circuit 100, at their respective points of origin, or elsewhere. In some embodiments, the precharge signal may be implemented as a clock signal having one phase designated as the precharge phase and another phase designated as the evaluate phase.

Following precharge and prior to assertion of any of hit signal 130 or miss signals 140, global match signal 170 may be in a deasserted state (e.g., a logic 0) indicating that no match has been detected. For example, output driver 160 may invert the precharged, asserted state of evaluate node 150 to produce global match signal 170 as shown. Additionally, it is noted that in the illustrated embodiment, coupling device 108 may be in a nonconducting state following precharge. For example, in embodiments where coupling device 108 is implemented as an NFET, device conduction may occur only when the device's gate voltage exceeds a certain threshold relative to the device's source or drain terminal. Thus, if source, gate and drain of device 108 are precharged to the same state, device 108 may in a nonconducting state. It is further noted that device 103 may be in a conducting state, owing to the precharged, asserted state of miss match line 120, while device 101 may be in a nonconducting state owing to the deasserted state of hit signal 130.

Subsequent to precharge, miss signals 140 or hit signal 130 may be evaluated (block 502). For example, in one embodiment, dual match line circuit 100 may be associated with an entry 20 of CAM 10 that includes a number of CAM bit cells 200. In such an embodiment, CAM bit cells 200 may be configured to evaluate and produce miss signals 140 and hit signal 130, for example in response to receiving an input data tag value to be compared against the contents of entry 20.

Depending upon how they are evaluated, hit signal 130 and miss signals 140 may be asserted or may remain deasserted, in various combinations. Generally speaking, assertion of hit signal 130 and deassertion of all miss signals 140 may indicate a global hit condition, whereas any other combination of states may indicate a global miss condition. Specifically, if hit signal 130 is asserted (block 504) and if none of miss signals 140 is asserted (block 506), hit match line 110 may discharge while miss match line 130 remains precharged (block 508). For example, under these conditions, device 101 may be activated for discharging by asserted hit signal 130, creating a discharge path for hit match line 110 through device 103, which may remain activated by precharged miss match line 120. Because no miss signals 140 are asserted, none of devices 104 may be activated for discharging miss match line 120.

Subsequent to hit match line 110 discharging and miss match line 120 remaining precharged, evaluate node 150 may be discharged (block 510) and global match signal 170 may be asserted, indicating a global hit (block 512). For example, the voltage differential arising in this case between hit match line 110 and miss match line 120 may activate coupling device 108, providing a discharge path through hit match line 110 for evaluate node 150.

Returning to block 506, if any of miss signals 140 is asserted while hit signal 130 is asserted, both hit match line 110 and miss match line 120 may begin discharging (block 514). For example, one or more of devices 102 and 104 may be activated for discharging by a corresponding miss signal 140. Also, devices 101 and 103 may initially be activated for discharging, creating an additional discharge path for hit match line 110. A potential race condition exists for this case, as the ultimate state of evaluate node 150 may depend upon the relative discharge rates of hit match line 110 and miss match line 120. If miss match line 120 discharges at least as quickly as hit match line 110, evaluate node 150 may remain precharged (block 516) and global match signal 170 may remain deasserted, indicating a global miss (block 518). For example, if the voltage difference between miss match line 120 and hit match line 110 remains less than the threshold needed to activate coupling device 108, device 108 may remain in a nonconducting state, allowing evaluate node 150 to remain precharged. It is noted that the electrical isolation of hit match line 110 and miss match line 120, relative to possible discharge paths for both lines, may facilitate balancing the loading (and thus the discharge rates) of both lines, which may in turn minimize the effect of the race condition.

Returning to block 504, if hit signal 130 is deasserted (block 504) and if none of miss signals 140 is asserted (block 520), both hit match line 110 and miss match line 130 may remain precharged (block 522). For example, under these conditions, neither device 101 nor any of devices 102 or 104 may be activated for discharging. Subsequently, evaluate node 150 may remain precharged (block 516) and global match signal 170 may remain deasserted, indicating a global miss (block 518). For example, because both hit match line 110 and miss match line 120 remain precharged, the voltage differential between the two match lines may remain less than the threshold needed to activate coupling device 108, preventing evaluate node 150 from discharging. It is noted that no race condition exists in this case.

Finally, returning to block 520, if any of miss signals 140 is asserted while hit signal 130 remains deasserted, both hit match line 110 and miss match line 120 may begin discharging (block 524). A race condition similar to that described above exists in this case as well. If miss match line 120 discharges at least as quickly as hit match line 110, evaluate node 150 may remain precharged (block 516) and global match signal 170 may remain deasserted, indicating a global miss (block 518).

It is noted that in the illustrated embodiment, the default precharge state of global match signal 170 indicates a global miss. In many embodiments, global match signal 170 will trigger other activity only when a global hit is indicated. For example, global match signal 170 may be used to select or activate other logic when asserted, such as by causing a particular data entry 40 to be output from CAM 10, while having no effect when deasserted. In some such embodiments, if the default state of global match signal 170 indicates a miss, logic that is controlled by global match signal 170 may be configured to respond directly to an assertion of global match signal 170 without regard to the timing of the assertion. By contrast, in embodiments where the default state of global match signal 170 indicates a global hit, a certain amount of time may be required to elapse before a receiver of global match signal 170 may be certain of the match signal state. For example, if the worst-case evaluation time of a match circuit has not yet elapsed, an asserted global match signal 170 may still either transition to a deasserted, miss state or remain asserted. Consequently, in embodiments where global match signal 170 defaults to a global hit, receivers of the signal may need to implement circuitry to synchronize evaluation of global match signal 170 within an expected valid window of time. Such synchronization circuitry may be unnecessary in embodiments in which the default state of global match signal 170 indicates a miss.

As described above, the embodiment of dual match line circuit 100 illustrated in FIG. 4 exhibits a race condition in the cases where any of miss signals 140 is asserted and hit signal 130 is either asserted or deasserted. Generally speaking, if miss match line 120 is configured to discharge at least as fast as hit match line 110, measured relative to the activation threshold of coupling device 108, dual match line circuit 100 will evaluate correctly despite the race condition. In one embodiment, the rate of discharge of miss match line 120 may be increased relative to hit match line 110 by increasing the physical size of devices 104 relative to devices 102. For example, the gate width ratio or drive ratio of devices 104 relative to devices 102 may be greater than 1:1.

Figure 6:
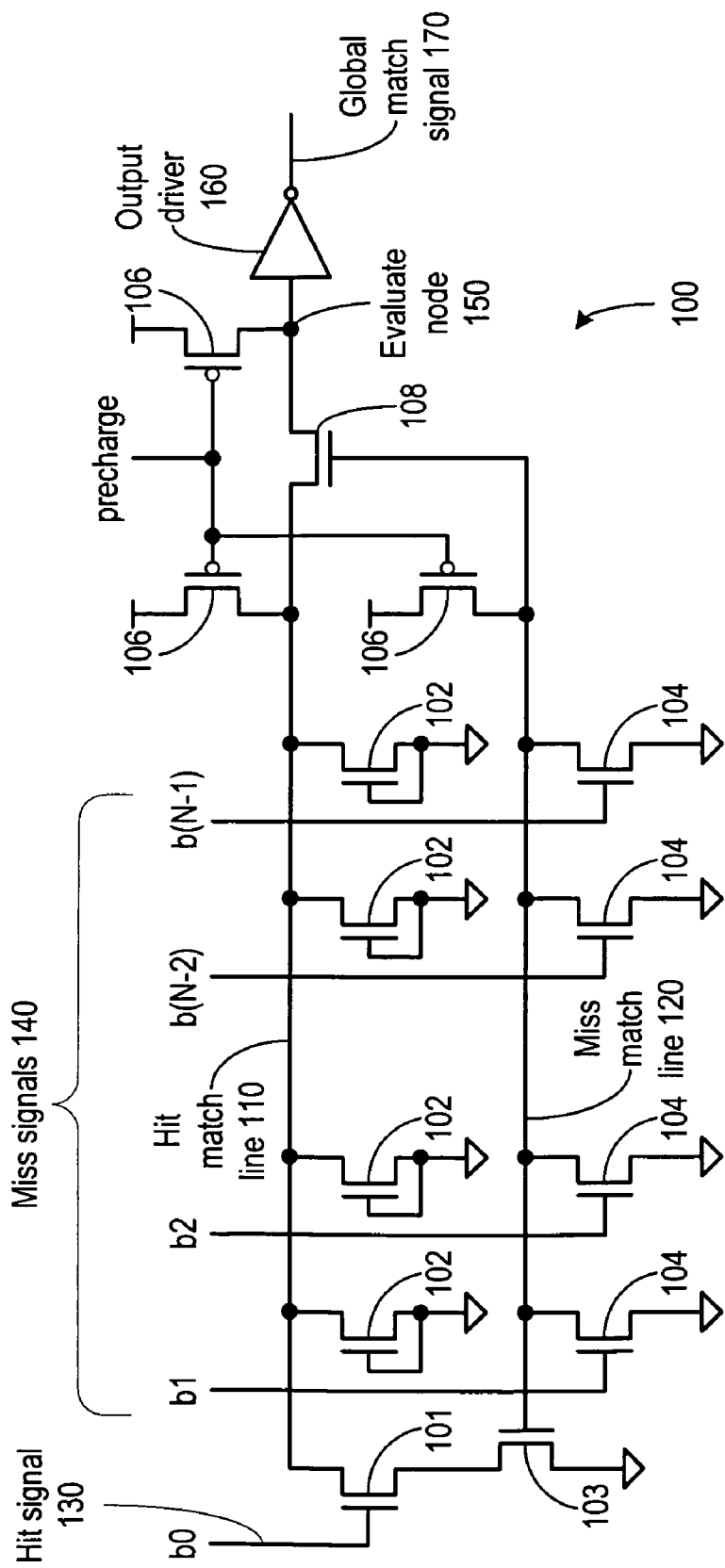
FIG. 6 is a block diagram illustrating another embodiment of a dual match line circuit.

The race condition may also be improved through structural modifications to dual match line circuit 100, one embodiment of which is illustrated in FIG. 6. In the illustrated embodiment, dual match line circuit 100 is configured similarly to the embodiment of FIG. 4, with the exception that each of load devices 102 is configured as a dummy load device rather than being configured for activation by a respective miss signal 140. For example, in the illustrated embodiment, the gate terminal of each of NFET devices 102 is coupled to ground, causing devices 102 to operate in a permanently nonconducting state. As a result, devices 102 may present a capacitive load to hit match line 110, while eliminating a number of potential discharge paths for the hit match line. Consequently, discharge of hit match line 110 may be slowed relative to miss match line 120, which may aid in managing race conditions between the two.

At the same time, configuring devices 102 as dummy loads may entirely eliminate one set of circumstances under which a race condition may occur. Generally speaking, operation of the illustrated embodiment of dual match line circuit 100 may be similar to the method illustrated in FIG. 5. However, the race condition that arises in block 524 (when hit signal 130 is deasserted and one or more of miss signals 140 is asserted) may not occur in the illustrated embodiment. As shown in FIG. 6, this combination of inputs causes device 101 to remain in a nonconducting state. As there exists no alternative discharge path for hit match line 110 when device 101 is not activated, hit match line 110 may remain precharged while miss match line 120 discharges through one or more of devices 104 that is activated by a corresponding miss signal 140. Elimination of the race condition under one set of circumstances may simplify the implementation of dual match line circuit 100, for example by eliminating a set of conditions under which worst-case testing and analysis may need to be performed.

It is noted that in the embodiment of dual match line circuit 100 of FIG. 6, a race condition may still occur in the event that both hit signal 130 and one or more of miss signals 140 is asserted (corresponding to block 514 of FIG. 5), in which case both hit match line 110 and miss match line 120 may begin discharging. In the embodiment of FIG. 6, hit match line 110 may only continue to discharge as long as devices 101 and 103 are activated. However, as miss match line 120 discharges through one or more of devices 104, the voltage on miss match line 120 decreases, which may cause device 103 to deactivate. In various embodiments, device 103 may deactivate gradually or quickly as its gate voltage changes relative to its threshold voltage, depending on its electrical characteristics, which may in turn depend on physical characteristics such as device size and composition. In one embodiment, if device 103 is quickly deactivated when miss match line 120 begins discharging, hit match line 110 may be prevented from discharging fully, whereas miss match line 120 may continue to discharge unimpeded through devices 104. If device 103 can be deactivated before hit match line 110 discharges appreciably, miss match line 120 may discharge substantially more quickly than hit match line 110, which may effectively eliminate the remaining race condition by causing miss match line 120 to deactivate coupling device 108 before evaluate node 150 discharges substantially through hit match line 110. Additionally, if the rate of discharge of miss match line 120 can be accelerated, coupling device 108 may be deactivated before evaluate node 150 discharges appreciably.

Figure 7:
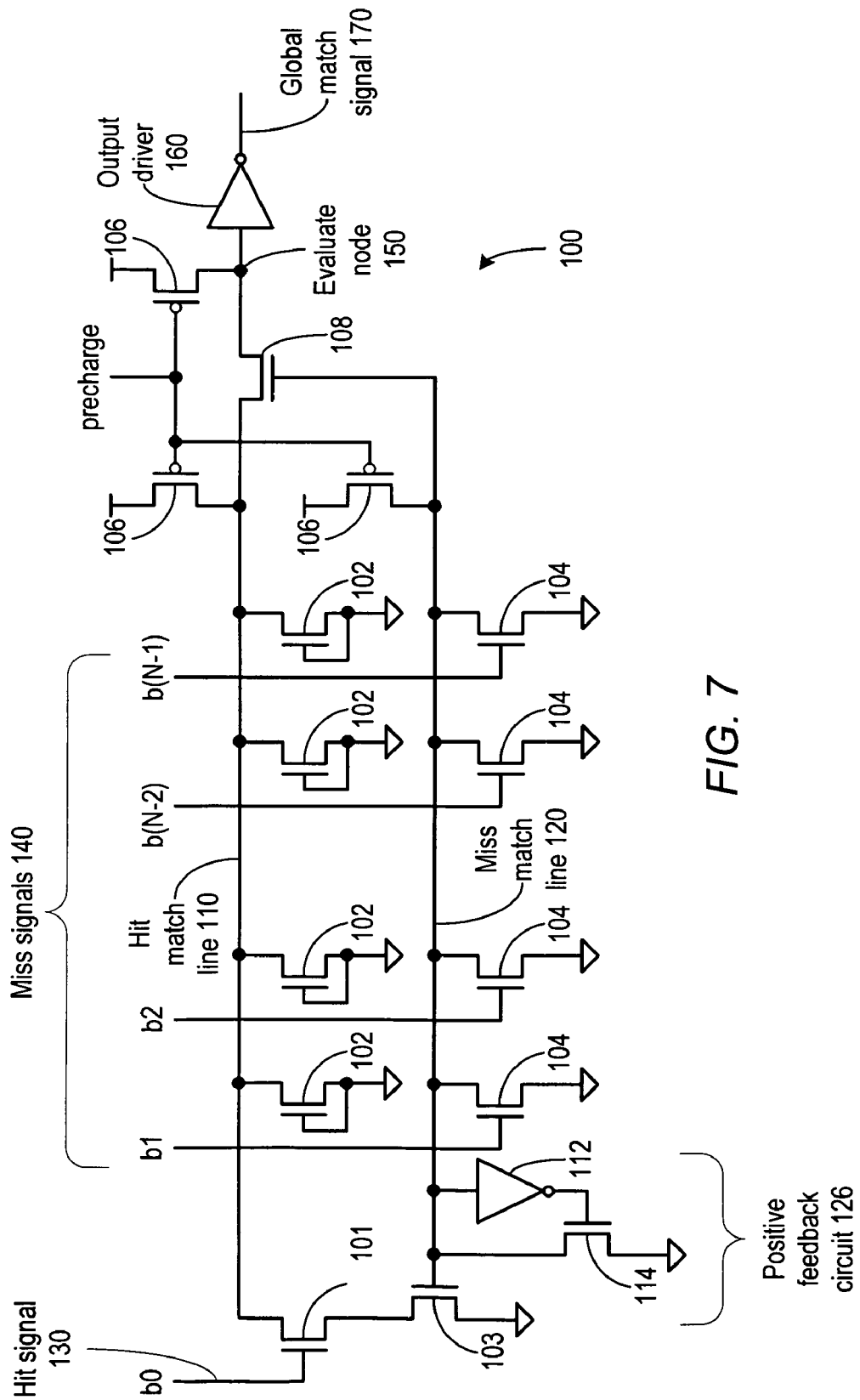
FIG. 7 is a block diagram illustrating an embodiment of a dual match line circuit including a positive feedback circuit configured to accelerate discharge of a miss match line.

FIG. 7 illustrates one embodiment of dual match line circuit 100 that is configured to enhance the rate at which miss match line 120 discharges, thus more quickly deactivating device 103 and coupling devices 108. The illustrated embodiment includes the dual match line circuit 100 shown in FIG. 6 with the addition of a positive feedback circuit 126 including a pulldown device 114 coupled to miss match line 120 and controlled by an inverter 112 also coupled to miss match line 120. The functional behavior of the illustrated embodiment may be similar to that of dual match line circuit 100 of FIG. 6, although the timing behavior of the illustrated embodiment may be modified by positive feedback circuit 126 as described below.

Generally speaking, inverter 112 may be configured to logically invert the logic value present at its input. For example, in an embodiment where a lower voltage (e.g., ground potential, 0 volts) represents a logic 0 value and a higher voltage (e.g., precharge voltage, such as 1.8 volts) represents a logic 1 value, inverter 112 may be configured to output a logic 0 (e.g., a lower voltage signal) when a logic 1 (e.g., a higher voltage signal) is input, and vice versa. Correspondingly, when miss match line 120 is in a precharged state (logic 1), inverter 112 may be configured to output a logic 0 (ground) that is insufficient to activate pulldown device 114. However, as miss match line 120 begins to discharge, the dropping voltage at the input to inverter 112 causes inverter 112's output voltage to rise. Rising voltage at the output of inverter 112 in turn may activate pulldown device 114 (e.g., when the voltage at the gate of device 114 exceeds the threshold voltage of device 114).

As device 114 activates, it may further discharge miss match line 120, causing voltage at the input of inverter 112 to drop further and resulting in a higher voltage at the output of inverter 112. This in turn may activate device 114 more strongly, increasing its capacity to discharge miss match line 120, and further decreasing the voltage at the input of inverter 112. Consequently, inverter 112 and pulldown device 114 form a positive feedback loop during discharge of miss match line 120, in which the behavior of each device accelerates corresponding behavior of the other device. In some embodiments, such an active feedback loop may assist in discharging miss match line 120 more quickly than a load device operating without feedback. It is noted that in other embodiments, positive feedback circuit 126 may be configured to include different types of circuit elements that may be arranged differently from the specific configuration shown.

In some embodiments, inverter 112 may be configured such that both rising and falling output transitions are relatively symmetric. For example, in such an embodiment, output voltage may be driven at 50% of maximum when the input voltage is at 50% of maximum, for either direction of transition. However, in one embodiment the rate of discharge of miss match line 120 when positive feedback circuit 126 is activated may be increased by skewing inverter 112 to produce an output that responds more quickly to a falling input transition than to a rising input transition. For example, in one embodiment the relative device sizes of the devices comprising inverter 112 may be sized such that inverter 112 drives an output voltage of, e.g., 60% of maximum when its input voltage falls to, e.g., 70% of maximum. That is, in this example, inverter 112's output voltage may rise twice as quickly as its input voltage falls, which may result in earlier activation of pulldown device 114 and generally increase the overall gain of the positive feedback loop. The degree to which the response of inverter 112 is skewed to favor a particular type of transition may vary in various embodiments. In many embodiments, skewing an inverter to respond more quickly to one direction of input transition may result in a slower response to the other direction of transition. However, in the case of dual match line circuit 100, the rising input transition of inverter 112 may be associated with a precharge mode of operation, in which the transition rate of inverter 112 may not be critical.

Use of positive feedback in dynamic circuits may increase a circuit's susceptibility to noise or glitches, such as noise that may be capacitively coupled to a node within a circuit. However, the overall capacitive loads associated with hit match line 110 and miss match line 120 may reduce the effect of noise. Further, in some embodiments, match lines 110–120 as well as positive feedback circuit 126 may be electrically shielded to reduce coupled noise. For example, in a semiconductor circuit, metal "wires" coupled to the ground plane or power grid may be routed alongside sensitive nodes for shielding.

Generally speaking, balancing the capacitive load presented by hit match line 110 and miss match line 120 may improve the overall performance of dual match line circuit 100. For example, balanced load between the two match lines may simplify management of the race conditions that may occur between them, enabling miss match line 120 to discharge at least quickly enough to disable coupling device 108 in the case where both match lines discharge concurrently. Additionally, balanced load between the match lines may improve certain types of noise immunity, for example by improving rejection of common-mode noise that is capacitively coupled to both hit match line 110 and miss match line 120.

In some embodiments, the degree to which loading of match lines 110 and 120 is balanced may be determined or adjusted according to a balancing criterion. For example, it may be impractical to exactly equalize loading of both lines across all possible variations in manufacturing process parameters and circuit operating conditions. Therefore, in some embodiments a balancing criterion may specify an acceptable bound on the degree to which loading of both lines may differ and be considered balanced. In various embodiments, such a criterion may be specified in relative terms, e.g., as a percentage of the total load of one or both match lines, or in absolute terms, e.g., as a certain number of units of capacitance such as picofarads (pF), femtofarads (fF), etc. In some embodiments, different balancing criteria may be associated with different manufacturing or operating parameters, or a single balancing criterion may be defined to encompass foreseeable variations in manufacturing or operation.

Figure 8:
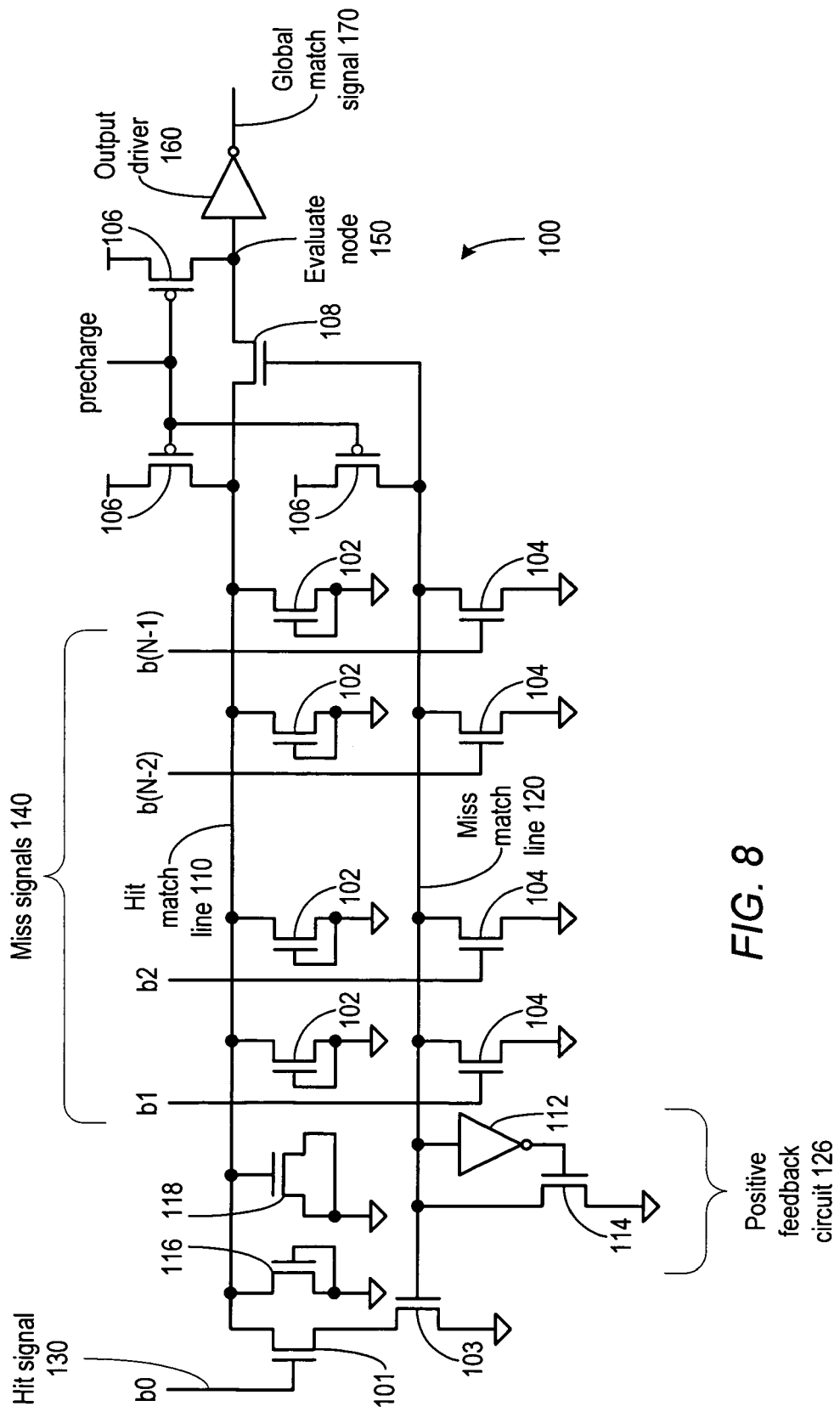
FIG. 8 is a block diagram illustrating one embodiment of load balancing of a dual match line circuit including a positive feedback circuit.

In the embodiment of FIG. 7, the addition of positive feedback circuit elements 112 and 114 may increase the overall loading of miss match line 120. To improve balance between loading of the two match lines, in the embodiment of dual match line circuit 100 shown in FIG. 8, additional dummy load devices 116 and 118 that are configured in a nonconducting state are added to hit match line 110 in the vicinity of the positive feedback devices of miss match line 120. Such dummy load devices may be sized or configured to adjust the loading balance between hit match line 110 and miss match line 120 according to a balancing criterion as described above. As shown in FIG. 8, a device may be configured as a dummy load device in several different ways. For example, device 116 may be configured to present a dummy source/drain capacitance to hit match line 110 that is similar to the source/drain capacitance presented to miss match line 120 by pulldown device 114. By contrast, inverter 112 may present gate capacitance rather than source/drain capacitance to miss match line 120, the effect of which is paralleled by configuring device 118 to present similar gate capacitance to hit match line 110. In one embodiment, the balancing criterion may be satisfied without directly measuring the capacitance of the positive feedback devices by approximately equalizing the sizes of dummy load device 116 and pulldown device 114, and by sizing dummy load device 118 to be approximately equal to the total device size of inverter 112. However, in other embodiments it is contemplated that more, fewer or differently-configured devices may be used as dummy loads to balance the capacitive load of hit match line 110 with respect to miss match line 120.

In each of the embodiments of dual match line circuit 100 discussed above, a structural asymmetry may exist between hit match line 110 and miss match line 120. Specifically, hit match line 110 may be coupled to a discharge path, which in some instances is its sole discharge path, that includes two devices 101, 103 connected in series, whereas discharge paths for miss match line 120 may include only single devices 104. Consequently, loading of hit match line 110 and miss match line 120 may remain slightly imbalanced even after the aforementioned techniques have been applied.

Figure 9:
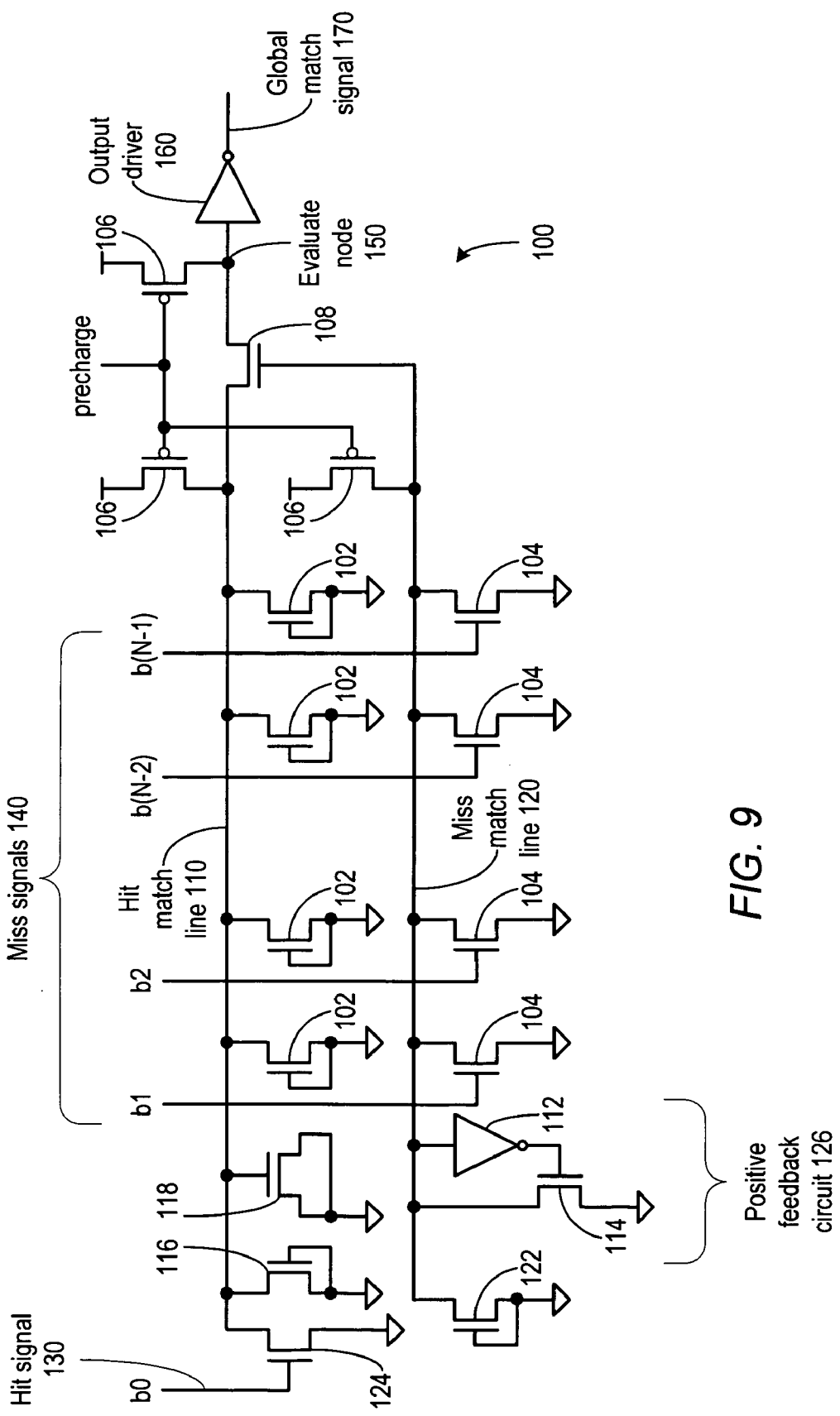
FIG. 9 is a block diagram illustrating one embodiment of a dual match line circuit including decoupled hit and miss match lines.

In the embodiment of dual match line circuit 100 illustrated in FIG. 9, series devices 101 and 103 shown in FIG. 8 have been replaced with devices 122 and 124 that are not connected in series, where device 124 is activated for discharging hit match line 110 by hit signal 130 and where devices 122 is configured as a dummy load on miss match line 120. Such a configuration may further improve the balance of loading between hit match line 110 and miss match line 120, as individual discharge paths for both match lines may pass through the same number of series devices (e.g., one device, as illustrated). Apart from this structural change, the functional operation of the illustrated embodiment may be similar to that of the embodiments shown in FIGS. 6–8. It is noted that while positive feedback loop devices 112 and 114 as well as dummy load devices 116 and 118 are shown in the embodiment of FIG. 9, some or all of these elements may be omitted in alternative embodiments.

Applications of Dual Match Line Circuits

Figure 10:
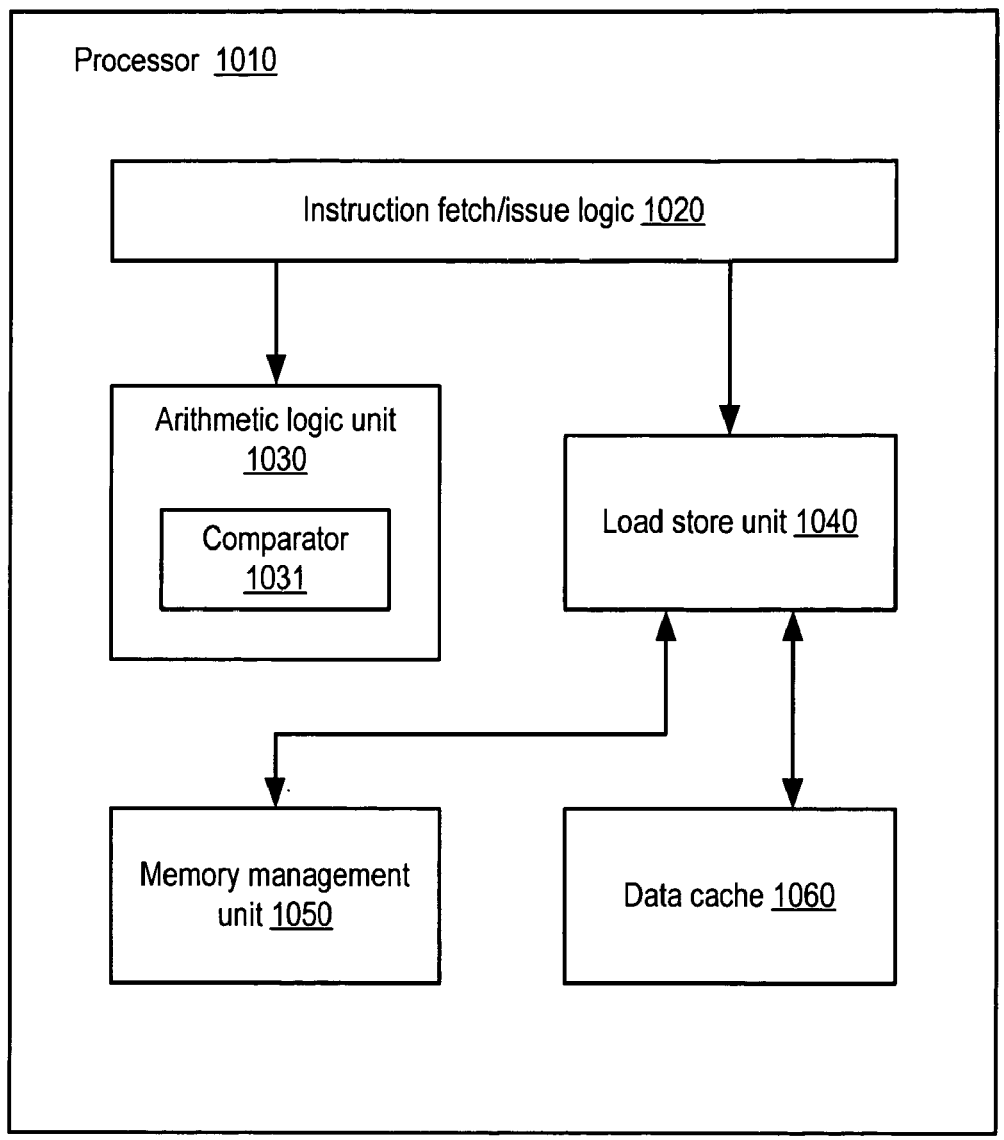
FIG. 10 is a block diagram illustrating one embodiment of a processor.

Any of the embodiments of dual match line circuit 100 illustrated in FIG. 4 and FIGS. 6–9 may be included in a variety of other circuits or applications where it may be necessary to combine multiple discrete indications, such as hit/miss indications, match/mismatch indications, etc. into a single global indication. One embodiment of a processor that may include one or more such applications of dual match line circuit 100 is illustrated in FIG. 10. In the illustrated embodiment, processor 1010 includes instruction fetch/issue logic 1020 coupled to an arithmetic logic unit (ALU) 1030 and a load store unit 1040. ALU 1030 includes a comparator 1031, and load store unit 1040 is coupled to a memory management unit 1050 and a data cache 1060.

In one embodiment, processor 1010 may be configured to execute instructions and to process data according to a particular instruction set architecture (ISA). In one embodiment, cores 100 may be configured to implement the SPARC® V9 ISA, although in other embodiments it is contemplated that any desired ISA may be employed, such as x86, PowerPC® or MIPS®, for example. In various embodiments, processor 1010 may be a single-threaded or multithreaded processor, and in some embodiments, processor 1010 may include a number of individual processor cores that may each autonomously execute instructions in a single-threaded or multithreaded fashion.

Instruction fetch/issue logic 1020, in one embodiment, may be configured to fetch instructions for execution, for example from a system memory or instruction cache (not shown), and to issue fetched instructions for execution by ALU 1030, load store unit 1040, or other functional units. In some embodiments, instructions may be issued for concurrent execution by different functional units (superscalar execution).

In respective embodiments, ALU 1030 and load store unit 1040 may be configured as functional units that respectively execute arithmetic/logical instructions, such as addition and Boolean instructions, and data movement instructions, such as load and store instructions, for example. In the illustrated embodiment, ALU 1030 includes comparator 1031 that may be configured to support a bitwise comparison of two operands as described below in conjunction with the description of FIG. 11. Additionally, load store unit 1040 may be configured to interface with memory management unit 1050 to obtain virtual memory translation information, and with data cache 1060 to obtain or store data, as described in detail below in conjunction with the descriptions of FIGS. 12 and 13. It is noted that in some embodiments, processor 1010 may include many other features not described above, or may include the illustrated elements in different combinations or configurations.

Figure 11:
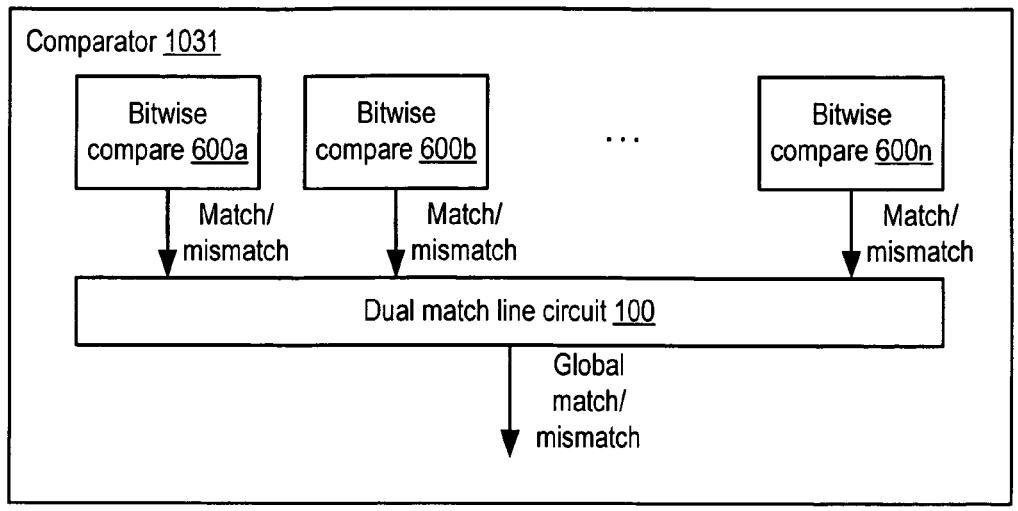
FIG. 11 is a block diagram illustrating one embodiment of a comparator that may employ a dual match line circuit.

One embodiment of comparator 1031 is illustrated in FIG. 11. In the illustrated embodiment, comparator 1031 includes a number of bitwise compare circuits 600. The number of compare circuits 600 may vary in different embodiments according to the size of the desired comparison. In one embodiment, each compare circuit 600 may be configured to compare corresponding bits of two or more input operands, such as may be received from ALU 1030 or another functional unit, to determine whether the bits match or mismatch. For example, each compare circuit may be configured as an XOR or XNOR circuit, depending on the desired logical sense of the comparison (e.g., to produce signal that indicates match or mismatch when asserted). In the illustrated embodiment, one of the embodiments of dual match line circuit 100 described above may be employed to combine the individual bitwise match signals into a single, global match signal. For example, one of compare circuits 600 may be configured to produce the equivalent of hit signal 130, while the rest may be configured to produce the equivalent of miss signals 140. Global match signal 170 of dual match line circuit 100 may then serve as an indication of the state of the comparison operation.

In the illustrated embodiment, processor 1010 may be configured to support a virtual memory address space accessible by software as well as a distinct, physical memory address space corresponding to physical memory that may be present within a system including processor 1010. Processor 1010 may further be configured to manage the correspondence between these two address spaces, for example to translate virtual addresses originating from software-based memory requests into physical addresses that may be processed by a physical memory interface. In the illustrated embodiment, processor 1010 includes MMU 1050 that may be configured to perform address translation and other functions relating to virtual memory operation.

Figure 12:
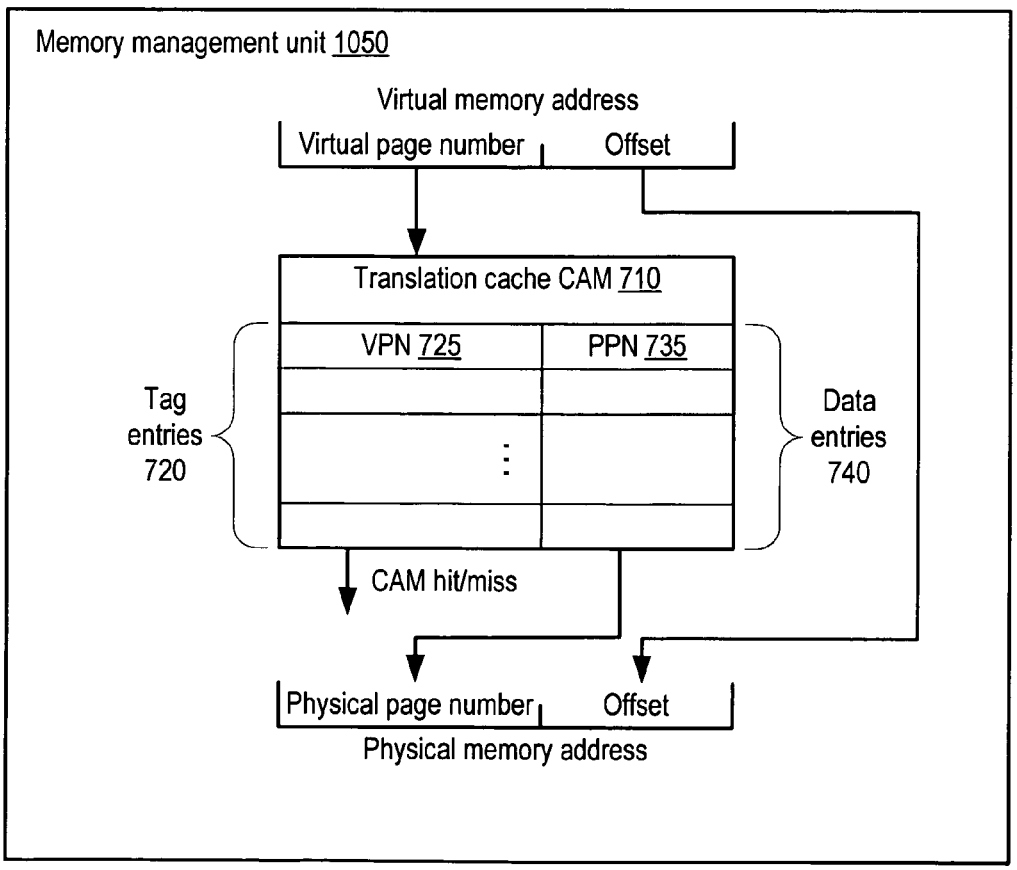
FIG. 12 is a block diagram illustrating one embodiment of a memory management unit that may employ a dual match line circuit.

A portion of an embodiment of MMU 1050, in which a suitable embodiment of dual match line circuit 100 may be employed, is illustrated in FIG. 12. In many embodiments of virtual memory systems, translations between virtual and physical addresses may be performed on the granularity of pages that may correspond to a number of contiguous memory addresses. Additionally, such translations may commonly be stored in a set of tables or other data structures that may be hierarchically navigated when a translation is needed. However, since numerous memory references may tend to cluster within a given memory page or set of pages, it may be inefficient to consult translation tables each time a translation is needed. Thus, in the illustrated embodiment, MMU 1050 implements a translation cache CAM 710 that may be configured to store a number of virtual memory translations and to provide access to stored translations more quickly than they might be obtained from translation tables.

In the illustrated embodiment, translation cache CAM 710 may be illustrative of CAM 10 and related components as described above and shown in FIGS. 1–3. Specifically, translation cache CAM 710 may include a number of tag entries 720 and corresponding data entries 740. Each tag entry 720 may correspond to a particular virtual page number (VPN) 725, while each data entry may specify a physical page number (PPN) 735 that corresponds to the VPN according to a particular translation. In some embodiments, CAM 710 may include other state information not shown, such as valid bits, usage history bits, or other data.

As shown in FIG. 12, in one embodiment a virtual memory address may include a VPN that generally corresponds to some number of the most significant bits of the address. The remaining address bits may specify an offset of the address into the specified VPN. In the illustrated embodiment, virtual pages and physical pages may be of the same size, such that the offset into a virtual page may be used as an offset into a corresponding physical page without modification. However, in other embodiments, page offset bits may participate in translation.

In one embodiment, when a virtual address requiring translation is presented to MMU 1050, CAM 720 may be responsively accessed. For example, in one embodiment a function unit such as load store unit 1040 may be configured to present all or a portion of a virtual address to MMU 1050. In particular, the VPN of the virtual address received from a functional unit may be presented as an input data tag value to CAM 720 for comparison with each of tag entries 720. As shown in FIGS. 1–3 and described above, in one embodiment an instance of dual match line circuit 100 may be implemented for each of tag entries 720. If one of dual match line circuits 100 indicates that its corresponding entry 720 is a match for the input VPN, the corresponding PPN may be selected and concatenated with the page offset to form a physical memory address that corresponds to the input virtual memory address according to a memory translation.

Figure 13:
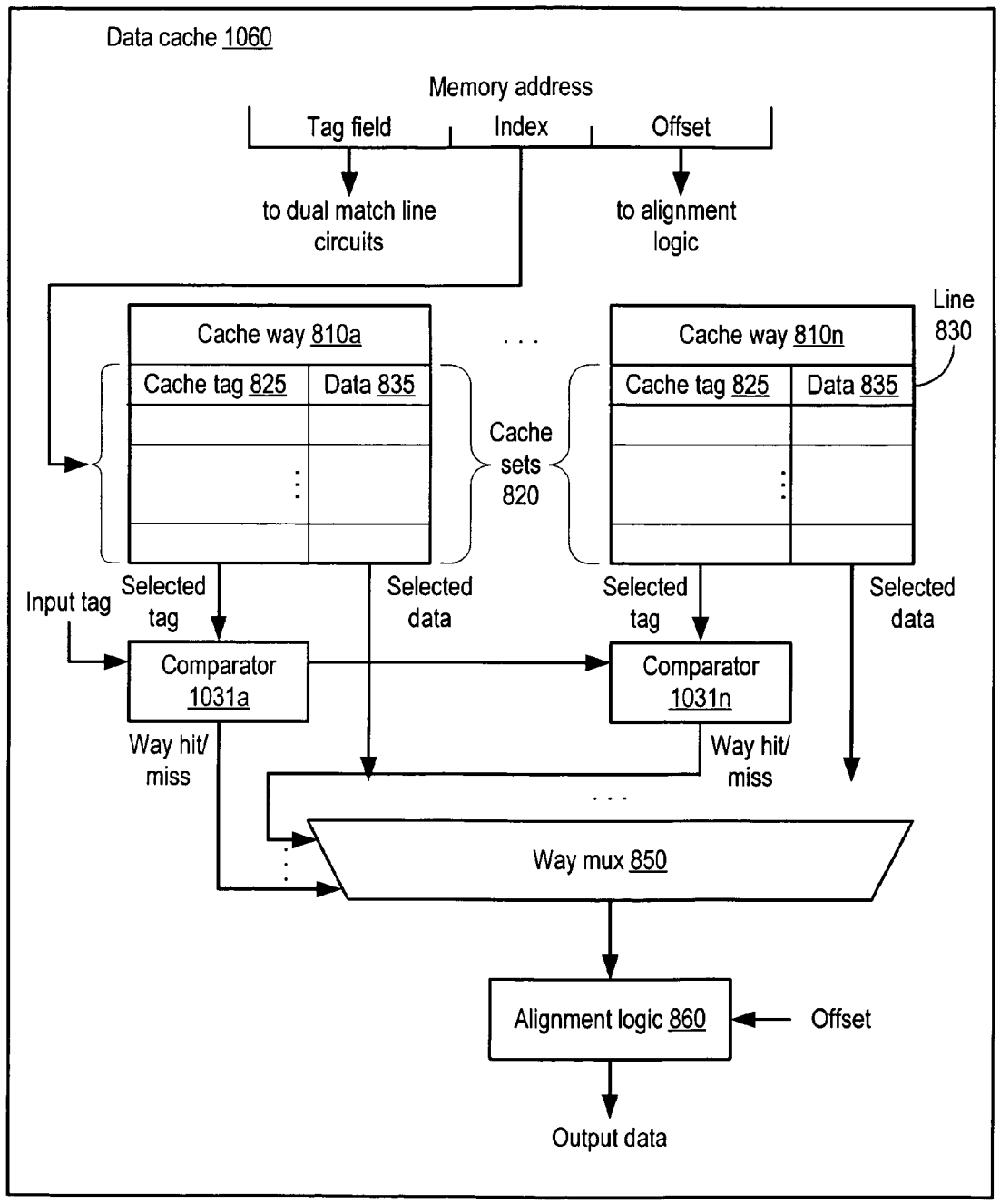
FIG. 13 is a block diagram illustrating one embodiment of a cache that may employ a dual match line circuit.

One embodiment of data cache 1060, in which a suitable embodiment of dual match line circuit 100 may be employed, is illustrated in FIG. 13. In the illustrated embodiment, data cache 1060 may be configured as a set-associative cache including a suitable number of cache ways 810*a–n*, although it is contemplated that dual match line circuit 100 may also be employed in direct-mapped caches. (It is noted that a direct-mapped cache may be considered a single-way set-associative cache.) Data cache 1060 also includes a number of cache sets 820 that may span each of cache ways 810. The intersection of a given set 820 and a given way 810 is illustrated as a cache line 830. In the illustrated embodiment, each set 820 may include a respective cache line 830 corresponding to each of ways 810. Each cache line 830 includes a cache tag field 825 and a corresponding data field 835. In some embodiments, it is contemplated that cache tags 825 and corresponding data 835 may be implemented in physically distinct arrays that may be accessed at different times during an access to data cache 1060.

In the illustrated embodiment, a particular set 820 may be selected in each of ways 810 by decoding a number of index bits of a memory address that is input to data cache 1060. For example, a functional unit such as load store unit 1040 may compute a memory address corresponding to a request for data that may occur in response to, e.g. a load or store instruction. Generally speaking, the number of index bits corresponds to the number of sets 820. For example, an embodiment of data cache 1060 that includes 1024 sets may employ 10 index bits of an input memory address to select a unique one of those sets. Once a particular set 820 has been selected, cache tags 825 may be read out from the lines 830 of each way 810 in the selected set 820 and compared against a tag field specified in an input memory address. In the illustrated embodiment, an instance of comparator 1031, including a suitable embodiment of dual match line circuit 100 as described above, may be provided for each of ways 810. Each comparator 1031 may be configured to compare the input tag field to the tag 825 selected for its respective way 810, indicating whether a tag hit or miss exists with respect to that way 810 in a manner similar to that described above with respect to FIGS. 1–9.

In an alternative embodiment, each cache tag 835 may be implemented as a CAM-style tag entry similar to entry 20 of CAM 10 described above. In such an embodiment, comparison of the stored cache tag may occur internally to cache tag 835, for example in response to a given set 820 being selected, rather than externally via a discrete comparator circuit. In one CAM-style cache tag implementation, an instance of dual match line circuit 100 may correspond to each cache tag 835 rather than each cache way 810.

Independently of the style in which tag comparison is performed to determine a cache way hit, if a particular way 810 hits, the data 835 from that way may be selected within way mux 850. Subsequently, a subset of the data may be selected and/or aligned within alignment logic 860 according to an offset field specified in the input memory address. The resulting data may then be provided as the output of data cache 1060.

It is noted that numerous variations on cache structure and organization are possible and contemplated, and that in some embodiments, an instruction cache, unified cache, or a second- or higher-level cache may be implemented using dual match line circuits 100 in a similar fashion. As noted above with respect to CAM 10, in some embodiments cache tags 825 may be managed by hardware or software to ensure that at most one copy of a given tag value occurs within a given set 820, thus preventing the possibility that multiple ways 810 might hit for a given input tag field.

Additionally, it is noted that although many of the foregoing embodiments have been discussed in the context of a general purpose processor 1010, it is contemplated that instances of comparator 1031, CAM 10, cache 1060 or other circuits employing a variant of dual match line circuit 100 may be implemented in any suitable structure. For example, such instances may be implemented within embedded processors, application specific integrated circuits (ASICs), digital signal processors (DSPs), or other types of circuits.

Exemplary System Embodiment

Figure 14:
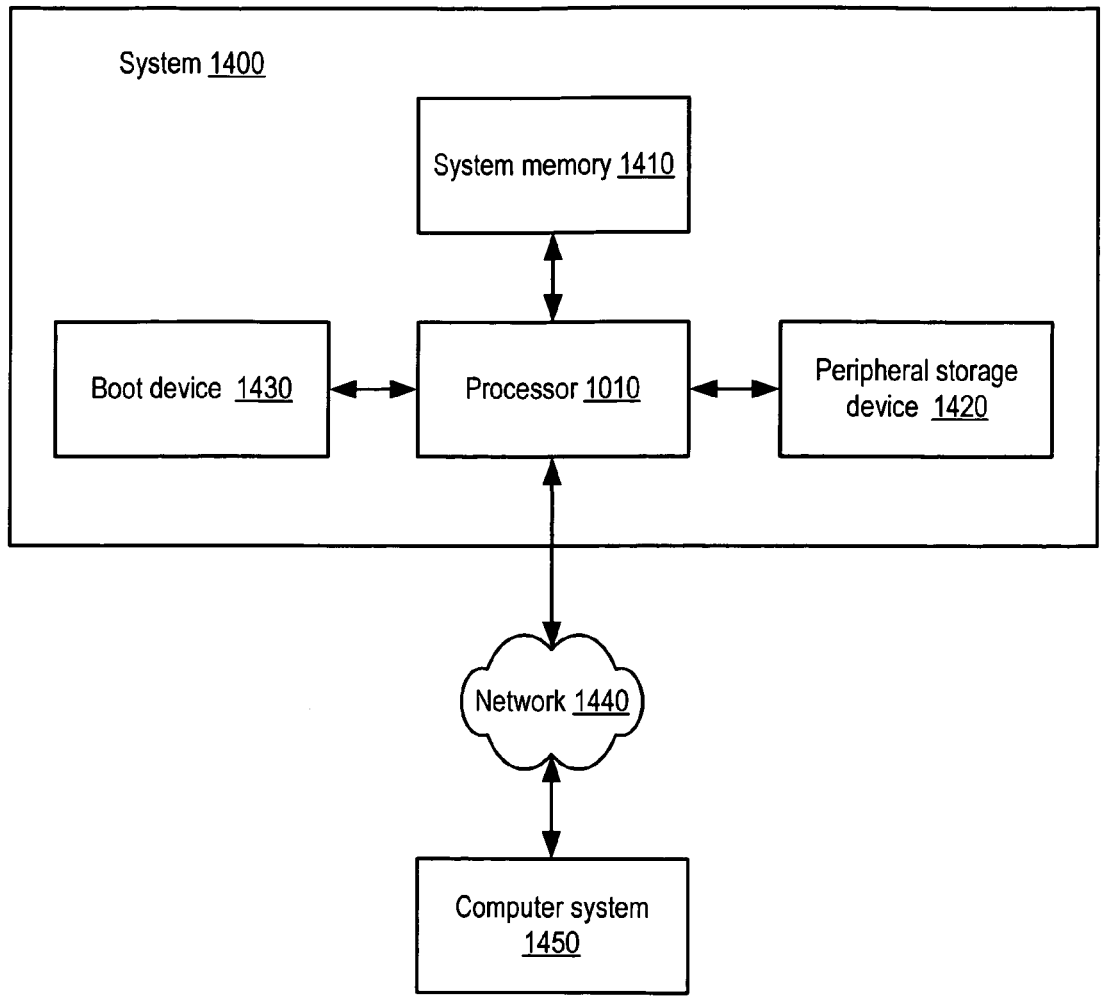
FIG. 14 is a block diagram illustrating one embodiment of a computer system.

In some embodiments, processor 1010 of FIG. 10, which may include one or several instances of dual match line circuit 100 as described above, may be implemented within a system and configured to interface with a number of external devices. One embodiment of a system including processor 1010 is illustrated in FIG. 14. In the illustrated embodiment, system 1400 includes an instance of processor 1060 coupled to a system memory 1410, a peripheral storage device 1420 and a boot device 1430. System 1400 is coupled to a network 1440, which is in turn coupled to another computer system 1450. In some embodiments, processor 1060 may include interface logic configured to interface directly with each of these devices, such as one or more memory interfaces, peripheral interfaces, network interfaces, boot interfaces, etc. In other embodiments, such interface logic may be implemented between processor 1010 and other devices, for example in a north bridge or north bridge/south bridge architecture. In some embodiments, system 1400 may include more than one instance of the devices shown, such as more than one processor 1010, for example. In various embodiments, system 1400 may be configured as a rack-mountable server system, a standalone system, or in any other suitable form factor. In some embodiments, system 1400 may be configured as a client system rather than a server system.

In various embodiments, system memory 1410 may comprise any suitable type of system memory. Peripheral storage device 1420 in various embodiments may include support for magnetic, optical, or solid-state storage media such as hard drives, optical disks, nonvolatile RAM devices, etc. In some embodiments, peripheral storage device 1420 may include more complex storage devices such as disk arrays or storage area networks (SANs), which may be coupled to processor 1010 via a standard Small Computer System Interface (SCSI), a Fibre Channel interface, a Firewire® (IEEE 1394) interface, or another suitable interface. Additionally, it is contemplated that in other embodiments, any other suitable peripheral devices may be coupled to processor 1010, such as multimedia devices, graphics/display devices, standard input/output devices, etc.

Boot device 1430, in one embodiment, may include a device such as an FPGA or ASIC configured to coordinate initialization and boot of processor 1010, such as from a power-on reset state. Additionally, in some embodiments boot device 1430 may include a secondary computer system configured to allow access to administrative functions such as debug or test modes of processor 1010.

Network 1440 may include any suitable devices, media and/or protocol for interconnecting computer systems, such as wired or wireless Ethernet, for example. In various embodiments, network 1440 may include local area networks (LANs), wide area networks (WANs), telecommunication networks, or other suitable types of networks. In some embodiments, computer system 1450 may be similar to or identical in configuration to illustrated system 1400, whereas in other embodiments, computer system 1450 may be substantially differently configured. For example, computer system 1450 may be a server system, a processor-based client system, a stateless "thin" client system, a mobile device, etc.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A dual match line circuit, comprising:
a hit match line coupled to a first plurality of load devices;
a miss match line coupled to discharge through a second plurality of load devices, wherein each of said second plurality of load devices is activated for discharging by a respective miss signal;
a positive feedback circuit coupled to said miss match line and configured to accelerate discharge of said miss match line in response to activation of one or more of said second plurality of load devices; and
precharge logic configured to precharge each of said hit match line, said miss match line and an evaluate node to an asserted state;
wherein said hit match line and said miss match line are coupled to said evaluate node via respective terminals of a coupling device;
wherein said hit match line is additionally coupled to a discharge path that is activated for discharging by at least a hit signal;
wherein said hit match line and said miss match line are electrically isolated from one another, such that when one or more of said respective miss signals are asserted, current from said hit match line does not discharge through said miss match line.

2. The dual match line circuit as recited in claim 1, wherein said positive feedback circuit includes a pulldown device and an inverter, wherein said pulldown device and an input of said inverter are each coupled to said miss match line, and wherein an output of said inverter is coupled to activate said pulldown device for discharging.

3. The dual match line circuit as recited in claim 1, further comprising one or more dummy load devices coupled to said hit match line, wherein said dummy load devices are configured to balance respective capacitive loadings of said hit match line and said miss match line according to a balancing criterion.

4. The dual match line circuit as recited in claim 1, wherein said discharge path includes a pair of devices connected in series, wherein a first one of said pair of devices is activated for discharging by said hit signal, and wherein a second one of said pair of devices is activated for discharging by said miss match line.

5. The dual match line circuit as recited in claim 1, wherein said discharge path includes one or more devices connected between said hit match line and a ground plane, wherein said one or more devices are activated for discharging by said hit signal.

6. The dual match line circuit as recited in claim 1, wherein each of said first and said second pluralities of load devices and said coupling device corresponds to one or more N-type field effect transistors (NFET), and wherein said precharge logic includes a plurality of P-type field effect transistors coupled respectively to said hit match line, said miss match line and said evaluate node.

7. The dual match line circuit as recited in claim 1, wherein said coupling device, when activated, is coupled to discharge said evaluate node through said hit match line.

8. The dual match line circuit as recited in claim 7, wherein said coupling device is activated for discharging by a voltage difference between said hit match line and said miss match line, wherein said voltage difference is in excess of a threshold value.

9. A content-addressable memory (CAM), comprising:
a plurality of tag entries each configured to store a corresponding tag value; and
a plurality of data entries each corresponding respectively to said tag entries and each configured to store a corresponding data value;
wherein a given tag entry includes:
the dual match line circuit as recited in claim 1; and
a plurality of bit cells coupled to said dual match line circuit, each configured to store a respective bit of said corresponding tag value and to compare said stored bit with a corresponding bit of an input tag value;
wherein a first one of said plurality of bit cells is configured to output said hit signal, and wherein remaining ones of said plurality of bit cells are configured to respectively output said miss signals.

10. A processor, comprising:
the content-addressable memory as recited in claim 9; and
a functional unit coupled to said content-addressable memory, wherein said functional unit is configured to provide said input tag value to said content-addressable memory.

11. A system, comprising:
the processor as recited in claim 10; and
a system memory coupled to said processor.

12. A cache, comprising:
a cache way including a plurality of cache lines, wherein each line includes a data value that corresponds to a cache tag value;
comparison logic configured to perform a bitwise comparison between a cache tag value corresponding to a selected one of said plurality of cache lines and an input tag value; and
the dual match line circuit as recited in claim 1 coupled to said comparison logic;
wherein said comparison logic is further configured to produce said hit signal and said plurality of miss signals, and wherein said dual match line circuit is configured to indicate whether said input tag value matches said cache tag value corresponding to said selected cache line.

13. A processor, comprising:
the cache as recited in claim 12; and
a functional unit configured to determine a memory address including said input tag value and to convey said memory address to said cache.

14. A system, comprising:
the processor as recited in claim 13; and
a system memory coupled to said processor.

15. A comparator, comprising:
the dual match line circuit as recited in claim 1; and
a plurality of bitwise comparison circuits coupled to said dual match line circuit, wherein each bitwise comparison circuit is configured to compare corresponding bits of two or more input operands, wherein a first one of said bitwise comparison circuits is configured to output said hit signal, and wherein remaining ones of said plurality of bitwise comparison circuits are configured to respectively output said miss signals.

16. A processor, comprising:
the comparator as recited in claim 15; and
a functional unit configured to provide said input operands to said comparator.

17. A system, comprising:
the processor as recited in claim 16; and
a system memory coupled to said processor.

18. A method, comprising:
precharging each of a hit match line, a miss match line and an evaluate node to an asserted state, wherein said hit match line and said miss match line are coupled to said evaluate node via respective terminals of a coupling device;
in response to detecting assertion of at least a hit signal, discharging said hit match line through a discharge path;
in response to detecting assertion of one or more of a plurality of miss signals, discharging said miss match line through one or more of a second plurality of load devices, wherein each of said second plurality of load devices is activated for discharging by a respective one of said plurality of miss signals;
in response to activation of one of more of said second plurality of load devices, a positive feedback circuit coupled to said miss match line accelerating discharge of said miss match line;
wherein said hit match line and said miss match line are electrically isolated from one another, such that when one or more of said miss signals are asserted, current from said hit match line does not discharge through said miss match line.

19. The method as recited in claim 18, wherein said positive feedback circuit includes a pulldown device and an inverter, wherein said pulldown device and an input of said inverter are each coupled to said miss match line, and wherein an output of said inverter is coupled to activate said pulldown device for discharging.

20. The method as recited in claim 18, wherein said discharge path includes a pair of devices connected in series, wherein a first one of said pair of devices is activated for discharging by said hit signal, and wherein a second one of said pair of devices is activated for discharging by said miss match line.

21. The method as recited in claim 18, wherein said discharge path includes one or more devices connected between said hit match line and a ground plane, wherein said one or more devices are activated for discharging by said hit signal.

22. A dual match line circuit, comprising:
a hit match line coupled to a first plurality of load devices and additionally coupled to a discharge path that is activated for discharging by at least a hit signal, wherein said hit match line is configured to be precharged to an asserted state;
a miss match line coupled to discharge through a second plurality of load devices and configured to be precharged to said asserted state, wherein each of said second plurality of load devices is activated for discharging by a respective miss signal; and
a positive feedback circuit coupled to said miss match line and configured to accelerate discharge of said miss match line in response to activation of one or more of said second plurality of load devices; and
wherein said hit match line and said miss match line are electrically isolated from one another, such that when one or more of said respective miss signals are asserted, current from said hit match line does not discharge through said miss match line.

23. The dual match line circuit as recited in claim 22, wherein said positive feedback circuit includes a pulldown device and an inverter, wherein said pulldown device and an input of said inverter are each coupled to said miss match line, and wherein an output of said inverter is coupled to activate said pulldown device for discharging.

* * * * *